United States Patent
Tran (10) Patent No.: US 6,385,079 B1
(45) Date of Patent: May 7, 2002

(54) METHODS AND STRUCTURE FOR MAXIMIZING SIGNAL TO NOISE RATIO IN RESISTIVE ARRAY

(75) Inventor: Lung T. Tran, Saratoga, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/944,680

(22) Filed: Aug. 31, 2001

(51) Int. Cl.$^7$ .............................................. G11C 11/00
(52) U.S. Cl. ...................................... 365/148; 365/158
(58) Field of Search .............................. 365/148, 158, 365/171, 173

(56) References Cited

U.S. PATENT DOCUMENTS

| | | | | |
|---|---|---|---|---|
| 5,173,873 A | * | 12/1992 | Wu et al. | 365/173 |
| 5,329,480 A | * | 7/1994 | Wu et al. | 365/171 |
| 5,946,227 A | * | 8/1999 | Naji | 365/158 |
| 6,097,625 A | * | 8/2000 | Scheuerlein | 365/171 |
| 6,169,686 B1 | | 1/2001 | Brug et al. | 365/158 |
| 6,341,084 B2 | * | 1/2002 | Numata et al. | 365/158 |

OTHER PUBLICATIONS

"Spin–dependent tunneling junctions with AlN and AlON barriers" by Manish Sharma, et al, Applied Physics Letters, vol. 77, No. 14, Oct. 2, 2000.

* cited by examiner

Primary Examiner—Trong Phan (57) ABSTRACT

A method for designing a resistive random access memory array in which elements are selected with values of resistances that are correlated to maintain a signal-to-noise ratio of 20 decibels or more for the array. A plurality of memory cells are selected and spaced from each other in a matrix of rows and columns, each memory cell being selected to have a junction resistance value of between 0.25 megaohms and 3.60 megaohms. A plurality of conductive row lines are selected and connected between a number N of memory cells in each row, each row and column line being selected to have a row or column unit line resistance value below 0.38 ohms, so that the values of junction resistance are correlated with the values of the row and column unit line resistance to provide a signal-to-noise ratio of 20 decibels or more for the memory array. The values of the row and column unit line resistance are selected so that the total row line resistance for each row is approximately equal to the total column line resistance for each column. The ratio of the junction resistance to the unit line resistance is approximately five million to one, in order to maintain a signal-to-noise ratio of at least 20 decibels in the resistive memory array. For an equal number N of row and column elements, the total row or column line resistance must be greater than approximately five million to N. If N is equal to approximately 1000, the ratio of junction resistance to total row or column line resistance must be approximately 5,000 or greater.

20 Claims, 7 Drawing Sheets

METHODS AND STRUCTURE FOR MAXIMIZING SIGNAL TO NOISE RATIO IN RESISTIVE ARRAY

BACKGROUND OF THE INVENTION

1. Field of Invention

The present invention pertains to the field of resistive memory cell arrays. More particularly, this invention relates to methods and structure for memory in a resistive memory array for maximizing the signal to noise ratio of the array.

2. Background

Figure 1:
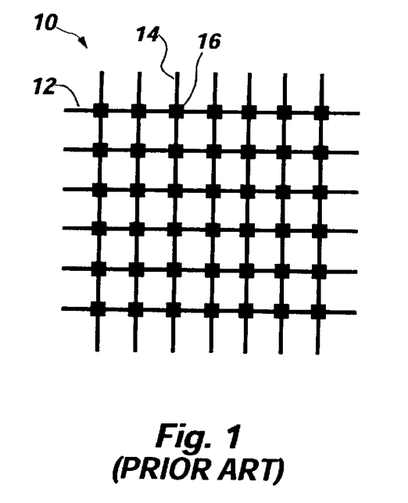
FIGS. 1 is a schematic view showing a prior art resistive cross point memory device according to the present invention.

A resistive random access memory (RAM) is a cross point type memory array of a planar matrix of spaced memory cells sandwiched between two meshes of conductors running in orthogonal directions above and below the cells. An example is the resistive RAM array 10 shown in FIG. 1. The row conductors 12 running in one direction are referred to as the word lines, and the column conductors 14 extending in a second direction usually perpendicular to the first direction are referred to as the bit lines. The memory cells 16 are usually arranged in a square or rectangular array so that each memory cell unit 16 is connected with one word line 12 and an intersecting bit line 14.

In a resistive RAM array, the resistance of each memory cell has more than one state, and the data in the memory cell is a function of the resistive state of the cell. The resistive memory cells may include one or more magnetic layers, a fuse or anti-fuse, or any element that stores or generates information by affecting the magnitude of the nominal resistance of the element. Other types of resistive elements used in a resistive RAM array include poly-silicon resistors as part of a read-only memory, and floating gate transistors as part of optical memory, imaging devices or floating gate memory devices.

One type of resistive random access memory is a magnetic random access memory (MRAM), in which each memory cell is formed of a plurality of magnetic layers separated by insulating layers. One magnetic layer is called a pinned layer, in which the magnetic orientation is fixed so as not to rotate in the presence of an applied magnetic field in the range of interest. Another magnetic layer is referred to as a sense layer, in which the magnetic orientation is variable between a state aligned with the state of the pinned layer and a state in misalignment with the state of the pinned layer. An insulating tunnel barrier layer sandwiches between the magnetic pinned layer and the magnetic sense layer. This insulating tunnel barrier layer allows quantum mechanical tunneling to occur between the sense layer and the pinned layer. The tunneling is electron spin dependent, causing the resistance of the memory cell, a function of the relative orientations of the magnetizations of the sense layer and the pinned layer. The variations in the junction resistance for the two states of the sense layer determine the data stored in the memory cell. U.S. Pat. No. 6,169,686, granted to Brug et al. on Jan. 2, 2001 discloses such a magnetic memory cell memory.

Figure 2:
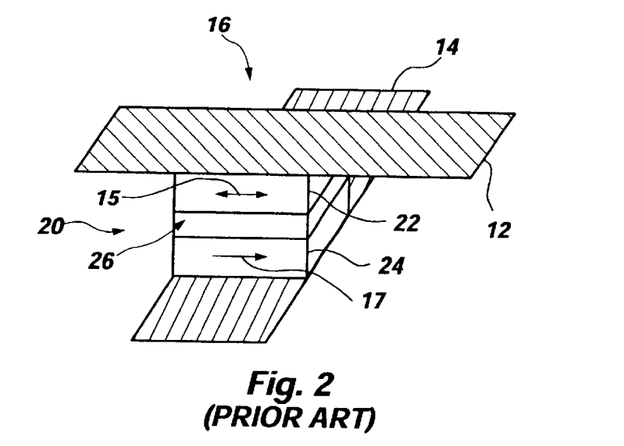
FIG. 2 is a schematic view showing the prior art structure of a MRAM memory cell and the conductors connected thereto.

Referring to FIG. 2, a MRAM memory cell is shown. Memory unit 16 is shown as a three-layer memory cell 20. In each cell 20 a bit of information is stored according to the orientation of a magnetic sense layer 22 of the cell 20. Usually, the cell 20 has two stable magnetic states corresponding to the logic states "1" and "0." The two-way arrow 15 on the sense layer 22 shows this binary-state capability. A pinned layer 24 in the cell 20 is separated from the sense layer by a thin insulator 26. Pinned layer 24 has a fixed magnetic orientation, such as shown by the one-way arrow 17 on layer 24. When the magnetic state of the sense layer 22 is oriented in the same direction as the direction of the magnetization of the pinned layer 24, the cell magnetization is referred to as "parallel." Similarly, when the magnetic state of the sense layer 22 is oriented in the direction opposite to the direction of the magnetization of the pinned layer 24, the cell magnetization is referred to as "anti-parallel." These orientations correspond to a low resistance state and a high resistance state, respectively.

The magnetic state of a selected memory cell 20 may be changed by applying currents to a word line 12 and a bit line 14 crossing the selected memory cell. The currents produce two orthogonal magnetic fields that, when combined, will switch the magnetic orientation of the selected memory cell 20 between the parallel and anti-parallel states. Other unselected memory cells receive only a magnetic field from either the word line or the bit line crossing the unselected memory cells. The single field is not strong enough to change the magnetic orientation of the unselected cells, so they retain their magnetic orientation.

Figure 3:
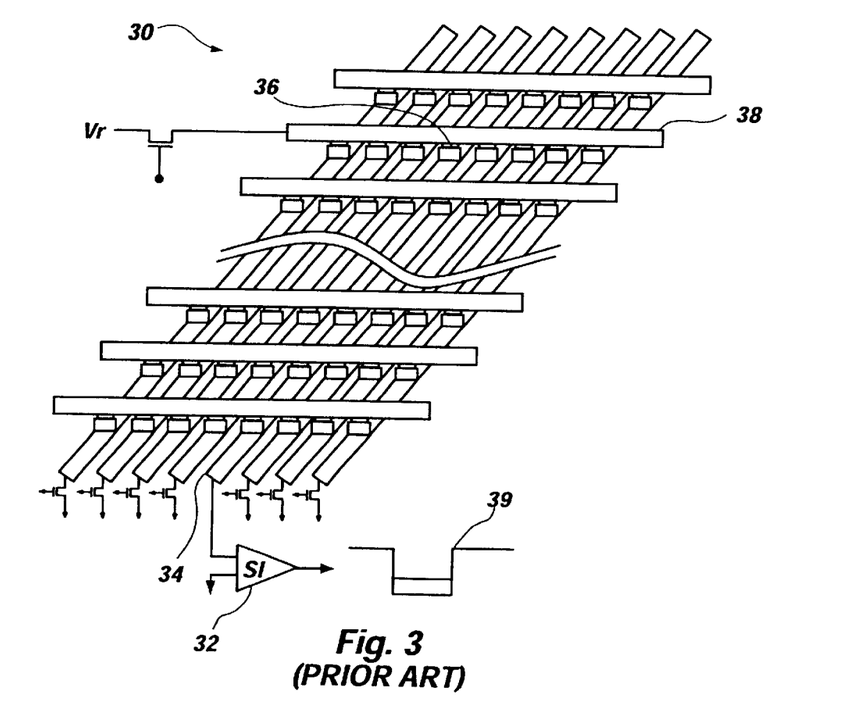
FIGS. 3 is a schematic view showing the prior art memory array structure with sensing elements according to the present invention.

Referring to FIG. 3, an MRAM memory array 30 is shown. A sense amplifier 32 is connected to the bit line 34 of a selected memory cell 36. A voltage $V_r$ is applied to the word line 38 of the selected memory cell 36, and sense amplifier 32 applies a voltage to the bit line 34 of cell 36. The sense amplifier 32 provides an amplified output 39 reflecting the state of the memory cell 36. The same bit line voltage is applied to all of the bit line 34, effectively biasing all the cells on unselected rows to zero potential. This action isolates the bit line currents from one another, effectively blocking most of the leakage current that might otherwise flow through secondary paths, possibly causing errors in the sensing function of the selected memory cell.

It is understood that the conductors of the word lines and bit lines in the magnetic array all have some amount of resistance to the flow of electricity through the lines. Also, a low resistance state and a high resistance state, corresponding to memory states "0" and "1" across the junction of the cross point cell. Although the effects of each such resistance is negligible in itself, the combined effect of these resistances in an array, particularly the conductor resistances, causes some reduction in the available sense current for the sense amplifier to determine the states "0" and "1" of the memory cell. If the array becomes too large, the conductor resistances increase because there are more rows and columns. Thus, more current is flowing, and the leakage current through the "sneak paths" also increases. Larger current and higher row and column conductor resistance in a large array can cause substantial voltage drops along the word lines and an unequal potential in the bit lines. These effects cause significant reduction in the sense current available to the sense amplifier that can lead to errors in sensing the states of the memory cells.

The problem of errors caused by combined resistances of the conductors becomes worse as the number of memory cells in a memory array are increased. Each conductor must be longer to connect to the increased number of memory cells, resulting is greater line resistance for each conductor. In addition, as arrays become larger, the design of the memory array is scaled smaller to increase the capacity without increasing size of the array. The conductors are made correspondingly thinner and narrower to be able to write data to the memory cells without substantially increasing the write current in the row and column conductors. This decreased thickness of the conductor results in more resistance along each conductor, increasing the possibility of errors or "noise" that interferes with the array output or signal.

The "magneto-resistive tunnel junction" (MTJ) junction of each memory cell in a MRAM array can also be a factor. As the memory is scaled down in size in order to increase capacity without substantially increasing the array size, there is an increase in MTJ resistance. This increased resistance leads to less tunneling current through the MTJ, thereby reducing the signal current. A "tunneling current" across the junction of each memory cell is a function of the MTJ resistance of each memory cell and can also contribute to the noise of the array. The MTJ resistance across the junction is affected by the material used in the cell and the respective polarizations of the layers on each side of the junction. See Sharma, et al "Spin-dependent tunneling junctions with AlN and AlON barriers," 77 Applied Physics Letters, number 14, Oct. 2, 2000.

Accordingly, it is desirable to determine an optimal resistance range of the memory cell and an optimal size of a memory array for a given conductor resistance in order to minimize undesirable error contribution to the output signal. Ability to detect data in the array is measured in terms of signal-to-noise ratio (SNR); higher SNR results in a lower error rate. The SNR is usually measured in decibels (dB). By maintaining the SNR of the array above an acceptable decibel level, the errors contributed by the resistance in the array are maintained at a tolerable level.

Stated another way, it is desirable to determine the MTJ resistance range with respect to memory array size and conductor resistance to minimize the error rate and thus maintain the signal-to-noise ratio above a minimum desirable threshold.

SUMMARY OF THE INVENTION

The present invention provides a method of designing a random access (RAM) memory array having resistive elements for optimizing the signal-to-noise ratio for the array. A plurality of memory cells are selected and spaced from each other in a matrix of rows and columns, each memory cell being selected to have a junction resistance values between 0.25 megaohms and 3.60 megaohms. A plurality of conductive row lines are connected between the memory cells in a row and are selected to have a row unit line unit resistance of values between substantially 0.0 ohms and 0.38 ohms. A plurality of conductive column lines are connected between the memory cells in a column and are selected to have a column unit line unit resistance between memory cells, the row unit line unit resistance being approximately equal to the column unit line unit resistance. The values of the memory cell junction resistance are correlated with the values of the row and column unit line resistance so that the signal to noise ratio of the memory array is maintained at 20 decibels or greater.

In another preferred embodiment of the present invention, a resistive random access memory array has selected elements with resistances correlated to maintain a signal-to-noise ratio of 20 decibels or more for the array. A plurality of memory cells are spaced from each other in a matrix of rows and columns, each memory cell being selected to have a junction resistance between 0.80 megaohms and 2.80 megaohms. A plurality of conductive row lines connect between the memory cells in a row are selected to have a determined row unit line resistance between memory cells having values in the range of substantially 0.0 ohms to 0.38 ohms. A plurality of conductive column lines are connected between the memory cells in a column and are selected to have a column unit line resistance having values in the range of substantially 0.0 ohms to 0.38 ohms. The memory cells are selected so that the junction resistance values are correlated with the row or column unit line resistance values, to maintain the signal to noise ratio at 20 decibels or more in the resistive memory array.

Preferably, an optimal design for a 1,024 by 1,024 memory cell array in which the row or column unit line resistance values are selected to be between approximately 0.24 ohms and 0.38 ohms, the range of junction resistance values is selected to be between 0.8 megaohms and 2.8 megaohms. Stated in broad terms, the junction resistance values and column and row unit line resistance values are selected so that the ratio of junction resistance values to row or column unit line resistance values is approximately five million to one.

In accordance with another preferred embodiment of the present invention, a magnetic random access memory (MRAM) array has resistive elements with resistances established to maximize a signal-to-noise ratio of at least 20 decibels for the array. A plurality of magnetic-resistive tunnel junction (MTJ) memory cells are selected and spaced from each other in a square matrix of approximately N rows and N columns, each memory cell being selected to have an MTJ resistance of between 0.25 megaohms and 3.60 megaohms. A plurality of conductive row lines are connected between the memory cells in each row, each row line being selected to have a total row line resistance of N times the row unit resistance between memory cells. A plurality of conductive column lines are connected between the memory cells in each column, each column line being selected to have a total column line resistance of N times the column unit resistance between memory cells. The row and column conductors are selected so that the total row line resistance for each row is approximately equal to the total column line resistance for each column. The MTJ resistance values and row and column conductor resistance values are selected so that the ratio of the MTJ resistance values to the total row or column line resistance values must be greater than approximately five million to N to maintain a signal-to-noise ratio of 20 decibels or more for the memory array. Preferably, where N is equal to approximately 1024, the MTJ resistance values are correlated with the row and column total line resistance values so that the ratio of MTJ resistance to total row or column line resistance is approximately 5,000 or greater.

Other aspects and advantages of the present invention will become apparent from the following detailed description, which in conjunction with the accompanying drawings illustrates by way of example the principles of the present invention.

DETAILED DESCRIPTION OF THE INVENTION

Figure 4A:
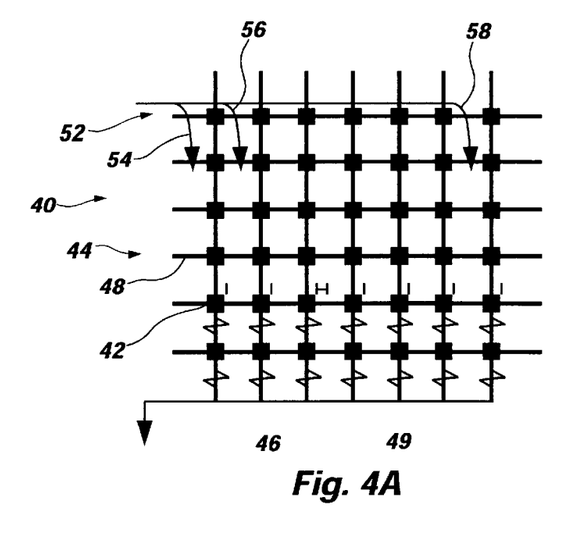
FIG. 4A is a schematic view showing leakage current and undesirable voltage drops in a memory array according to the present invention.

With reference to FIG. 4A, one preferred embodiment of the present invention is an MRAM memory cell array 40. The MRAM device 40 includes an array of memory cells 42 arranged in rows 44 and columns 46, with the rows 44 extending along an x-direction and the columns 46 extending along a y-direction.

Only a relatively small number of memory cells 42 are shown to simplify the description of the invention. In practice arrays of 1024 by 1024 memory cells or larger are used and the number of memory cells in the rows may not be the same as the number of memory cells in the columns.

Conductors 48 functioning as word lines extend along the x-direction in a plane on one side of the memory cell array 40. Conductors 49 functioning as bit lines extend along the y-direction in a plane on the other side of the memory cell array 40. Preferably, there is one word line 48 for each row of the array 40 and one bit line 49 for each column of the array 40. Each memory cell 42 is located at a crossing point of a corresponding word line 48 and bit line 49.

The memory cells 42 are not limited to any particular type of device. A spin dependent tunneling device may be used, as described above. Data is stored in the memory cells 42 by orienting the magnetization of each cell to represent a "1" or a "0." For example, referring to FIG. 2, the logic value of "0" may be stored in the memory cell 42 by orienting the magnetization of the sense layer to be parallel to the magnetic orientation of the pinned layer, and the logic value of "1" may be stored in the memory cell by orienting the magnetization of the sense layer to be opposite in direction, or anti-parallel, to the magnetic orientation of the pinned layer.

The logic value is stored in a selected memory cell as described above. With a voltage applied to the word line and bit line of the selected cell, the current across the junction of the memory cell determines whether the cell magnetization is parallel or anti-parallel. Preferably, an anti-parallel orientation will cause greater MTJ resistance and thus lower current across the junction of the selected memory cell. Preferably, each memory cell retains the magnetic orientation in the absence of power, thus being referred to as "non-volatile."

Figure 4B:
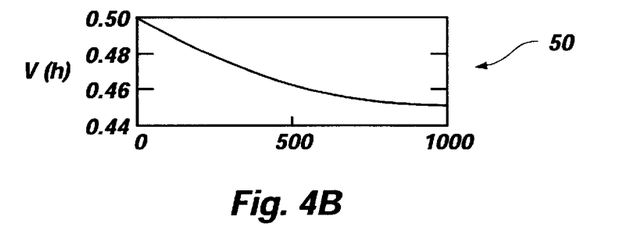
FIGS. 4B and 4C are graphical representations of the variations in applied voltage and the amount of signal current loss (error) as a function of the number of elements along a conductor line, according to the present invention.
Figure 4C:
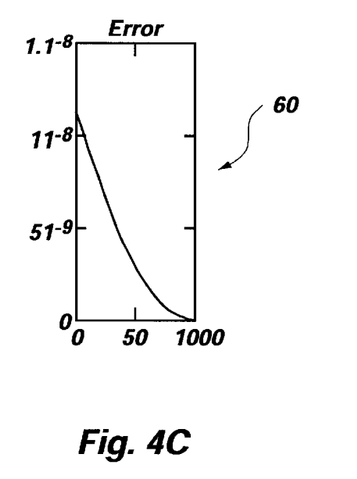

Graph 50 in FIG. 4B shows the variations in applied voltage along a word line 52. Arrows 54, 56 and 58 along word line 52 illustrate the current flow and voltage drop as current progresses along word line 52. As shown in FIG. 4B, an initially applied voltage of 0.50 volts at the beginning of the word line 52 will drop to less than 0.45 volts at the end of a conductor connecting 1,000 memory cells. The graph 60 in FIG. 4C shows the resultant leakage current due to column conductor resistance with respect to the row location. The leakage current is about $1.1 \times 10_{-8}$ amperes and reduces to effectively zero at the last row conductor connecting 1,000 memory cells. The row further away from the sense amplifier suffers more leakage current than the rows near the sense amplifier because conductor resistance is larger.

Figure 5:
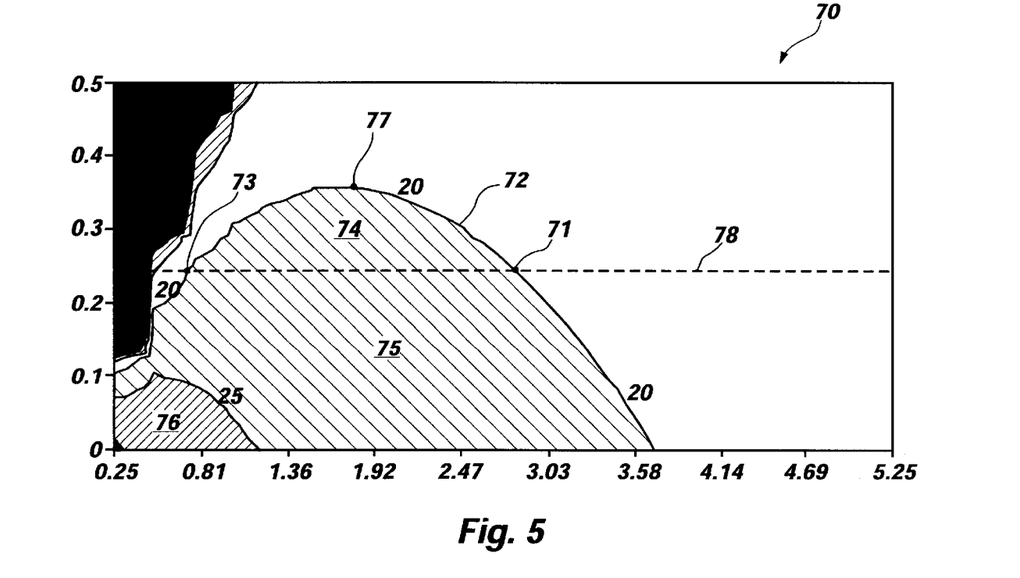
FIG. 5 is a contour plot, graphically representing the signal-to-noise ratio as a function of conductor unit resistance and MTJ resistance, in accordance with the present invention.

Referring now to FIG. 5, a contour plot 70 is given, showing the signal-to-noise ratio in decibels as a function of conductor unit resistance in ohms (y-axis) and MTJ resistance of a memory cell in megaohms (x-axis). A conductor unit resistance above the dashed line 78, at about 0.24 ohms, can be easily manufactured with existing fabrication processes and commonly used metals, such as copper, aluminum or aluminum copper alloy. A lower conductor resistance unit is possible by increasing the width and thickness of the conductor, but this will have a detrimental effect by causing the size of the array to increase, so that more current is needed to write data to the array. A new development metal alloy or super conductor is preferred to lower the unit conductor resistance, but they may be impractical at the present time.

A 20 decibels contour line 72 has been determined to represent a threshold below which the SNR should not drop in order to maintain acceptable low levels of error rates in the array. Below the contour line 72, the SNR will be higher than 20. It is preferred that the SNR be above line 78 (0.24 ohms) for ease in manufacturing, but below line 72 to maintain an acceptable SNR. Thus, the optimal design range is shown by the shaded area 74 in FIG. 5 bounded by the 20 dB contour line 72 and the dashed line 78. In this range the unit conductor resistance and the MTJ resistance range are optimal for the memory array while still maintaining a 20 dB SNR or better.

In reviewing contour plot 70, it is apparent that row and column conductors should be selected having a conductor unit resistance below about 0.38 ohms in order to keep the SNR at or above 20 decibels. Preferably, the row and column conductors are selected having a unit resistance in the range of substantially 0.0 ohms to 0.38 ohms, if the conductor range is available. For the contour plot of FIG. 5, the row and column unit resistances are assumed to be the same. However, the scope of the present invention is intended to include different row and column unit resistances, as long as they each fall within the range between substantially 0.0 ohms and 0.38 ohms. Likewise, the number of rows and columns may differ, depending on the circuitry design.

The memory cells are selected so that the MTJ resistance of each memory cell is between about 0.25 megaohms and 3.60 megaohms, preferably in the range of about 0.8 megaohms to 2.8 megaohms, depending on the unit conductor resistance. The memory cell junction values are then correlated with the row and column unit line resistance values to provide a signal-to-noise ratio of at least 20 decibels in the memory array.

Looking at FIG. 5, the selection of resistive elements in a memory array where the range of conductor resistance below 0.24 ohms, and a range of junction resistance between 0.25 megaohms and 3.60 megaohms is more difficult to achieve in manufacturing, but still falls within the scope of the present invention. In FIG. 5, this area is designated as area 75 for an SNR between 20 and 25 dB, and area 76 for an SNR above 25 dB. These areas represent ranges of resistive elements that are harder to achieve, particularly for area 76. However, they may be achievable with special conditions, as mentioned earlier, and are included within the scope of the present invention.

Conductor unit resistance will vary depending on the size of the array, since thinner conductors are needed as the array becomes larger. Thus, to some degree, the size of the array will determine the conductor unit resistance. For an array of about 1,024 by 1,024 memory cells, a conductor unit resistance of about 0.24 ohms could preferably be selected, indicated by dotted line 78. The intersections of dotted line 78 with contour line 72 at points 71 and 73 define the acceptable range of MTJ resistance values to be between about 0.8 megaohms and 2.8 megaohms.

Accordingly, in one preferred embodiment of the present invention, for a 1,024×1,024 memory cell array with row and column conductors selected to have a conductor unit line resistance values of about 0.24 ohms, the total resistance of each row is 246 ohms and the total resistance of each column is 246 ohms. The memory cells are selected so that the range of MTJ resistance values is between 0.8 megaohms and 2.8 megaohms. This information is extremely valuable for circuit designers in maintaining acceptable SNR levels for a typical memory array.

FIG. 5 shows a maximum value, at point 77, of about 0.38 ohms, above which the conductor unit line resistance values should not go. Thus, contour line 72 in FIG. 5 indicates that for the highest conductor unit line resistance value of about 0.38, the memory cells should be selected to have an MTJ resistance value of about 1.8 megaohms. Accordingly, the MTJ resistance values and row and column unit line resistance values are selected so that the approximate ratio of MTJ resistant to conductor unit line resistance is about $1.8 \times 10^{+6}$ to $3.8 \times 10^{-1}$ or, roughly about five million to one. In designing the memory array, the memory cells and row and column conductors are chosen so that the MTJ resistance values are correlated with the row and column unit line resistance values to provide a signal-to-noise ratio of at least 20 decibels in the memory array.

Looking at the contour plot in FIG. 5 for assistance in designing an array with N rows and M columns, one can determine the effective ratio of MTJ resistance to total line resistance for a given number of memory elements N in a row and a given number of memory elements M in a column. The total line resistance of a conductor for the maximum acceptable conductor unit line resistance value is 0.38 ohms times the number of memory elements N in a conductor line. For the maximum acceptable unit line resistance, the optimal MTJ memory cell resistance value is about 1.8 megaohms. Therefore, the ratio of MTJ memory cell resistance to total conductor line resistance is about $1.8 \times 10^{+6}$ to $3.8 \times 10^{-1} \times N$, that is about $5 \times 10^{+6}$ to one N, or five million to N. Thus, for a typical array of 1,024 by 1,024 memory cells, the ratio of MTJ memory cell resistance to total line resistance is about 5,000 to one. These parameters and ratios are of great assistance to an MRAM array designer in quickly determining the relative values of resistances in the array.

Preferably, the row and column conductors are made of highly conductive materials, such as copper or aluminum or even super conductor materials. In the MRAM memory cells, the pinned layer is composed of anti-ferrous material and the sense layer is composed of magnetic material influenced by a magnetic field, such as nickel iron, cobalt iron or nickel iron cobalt. The insulation layer may be composed of any type of insulation material and is very thin, usually not more than ten to fifty angstroms to allow a tunneling current to occur.

In one example, the cell junction resistance states may change between 1.0 megaohms at the low state and 1.3 megaohms for the high state. If a voltage of 0.5 volts is applied across the junction, the resulting current is about 500 nano-amps for the low state and 384 nano-amps for the high state. Thus, for sensing data in the memory cell, the current signal variation or window is typically only about 116 nano-amps in the ideal case. With the loss of signal due to column and row resistance the effective window is even less. Accordingly, careful design of the array elements is essential to maintain a satisfactory signal-to-noise ratio in the array.

The equation that provides the contour plot shown in FIG. 5 is as follows:

$$\text{SNR} := 20 \log (I\_signal/N_{rms}) \quad (1)$$

where:

SNR is the signal-to-noise ratio in decibels, $N_{rms}$ is the total noise in the array and I_signal is the estimated signal available for sensing a memory cell.

The estimated total noise with the assumption that sense amplifier noise is equal to array noise is derived as follows:

$$N_{rms} := \sqrt{[4 \cdot k \cdot T \cdot 1/R + (4 \cdot k \cdot T \cdot 1/R) + 4 \cdot k \cdot T \cdot 1/R \cdot m] \cdot BW \cdot \sqrt{2}} \quad (2)$$

where:

BW is the frequency bandwidth of the sense amplifier,

T is the temperature in degrees Kelvin, R is the resistance of the TMR junction, k is the Boltzmann's constant, and m and n are the number of rows and columns in the array.

The estimated signal available for sensing, I_signal is derived from the following equation:

$$I\_signal := (1 - I\_loss) \cdot (1 - 1/dR) \cdot V/R \quad (3)$$

where:

V is the applied voltage for sensing the state of the memory cells,

R is the memory junction resistance, dR is the ratio of junction resistances at the high and low states, and I_loss is derived as:

$$I\_loss := \frac{3 \cdot V \cdot \left(1 - \frac{1}{dR}\right) \cdot r_c}{R^2 \cdot \left(1 + \frac{dR}{n-1}\right)} \cdot \left[\sum_{i=1}^{m}(m - i)\right] \quad (4)$$

where $r_c$ is the resistance of the conductors in ohms per square unit.

Figure 6:
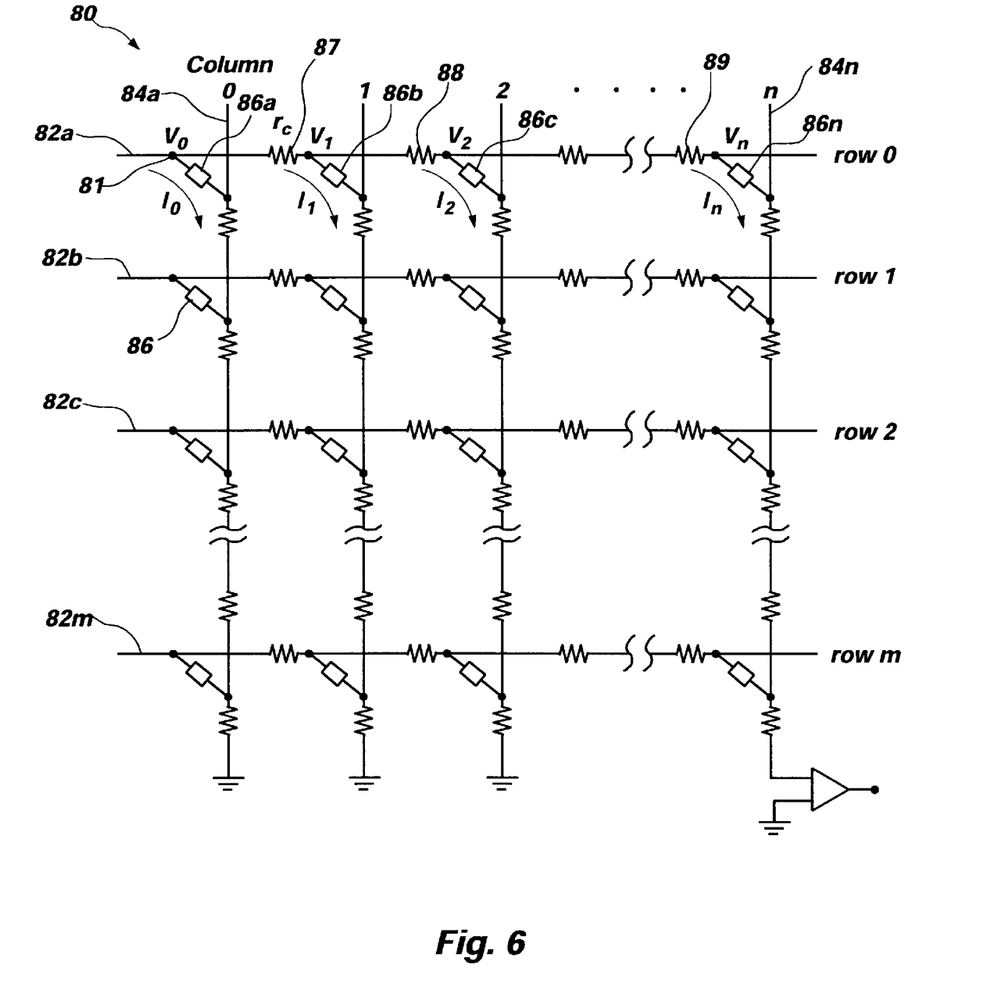
FIGS. 6, 7 and 8 are circuitry schematics showing the dynamics of a memory cell array with respect to resistances, current flows and voltages in the array, according to the present invention.
Figure 7:
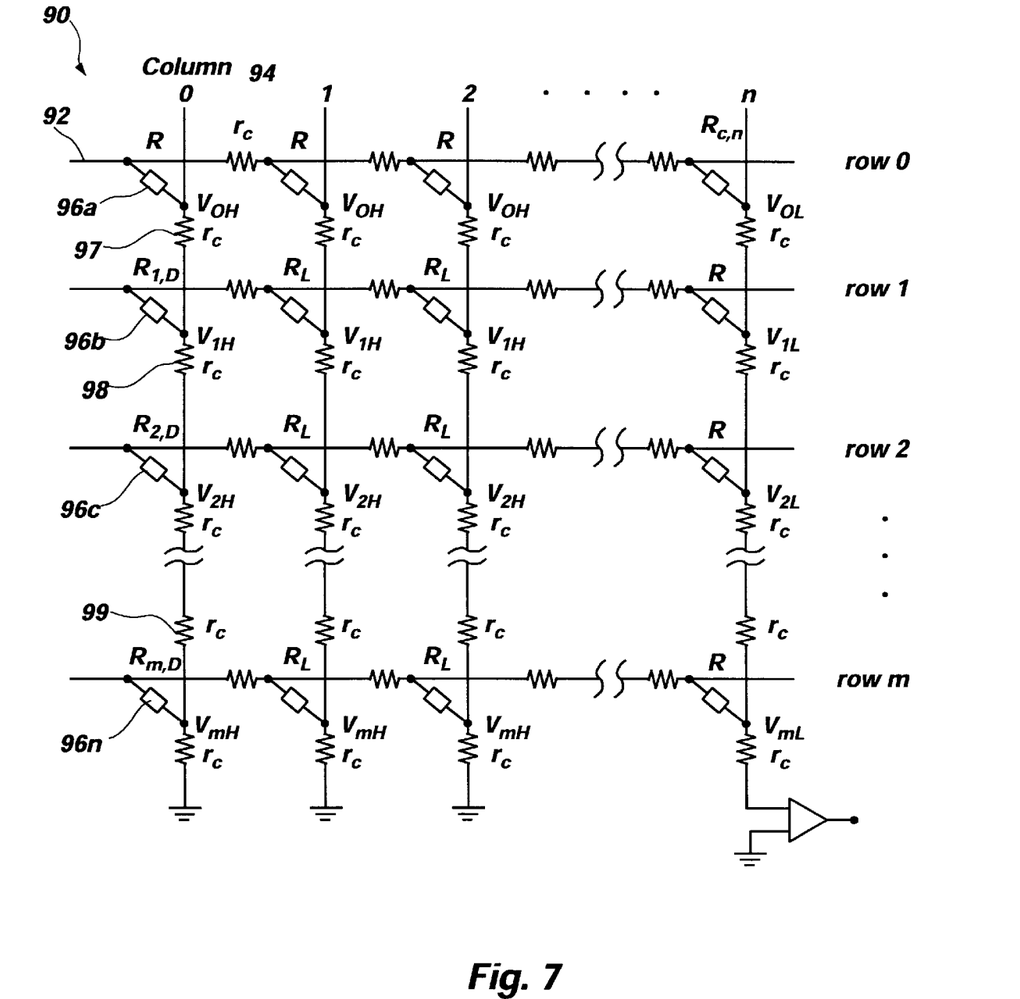
Figure 8:
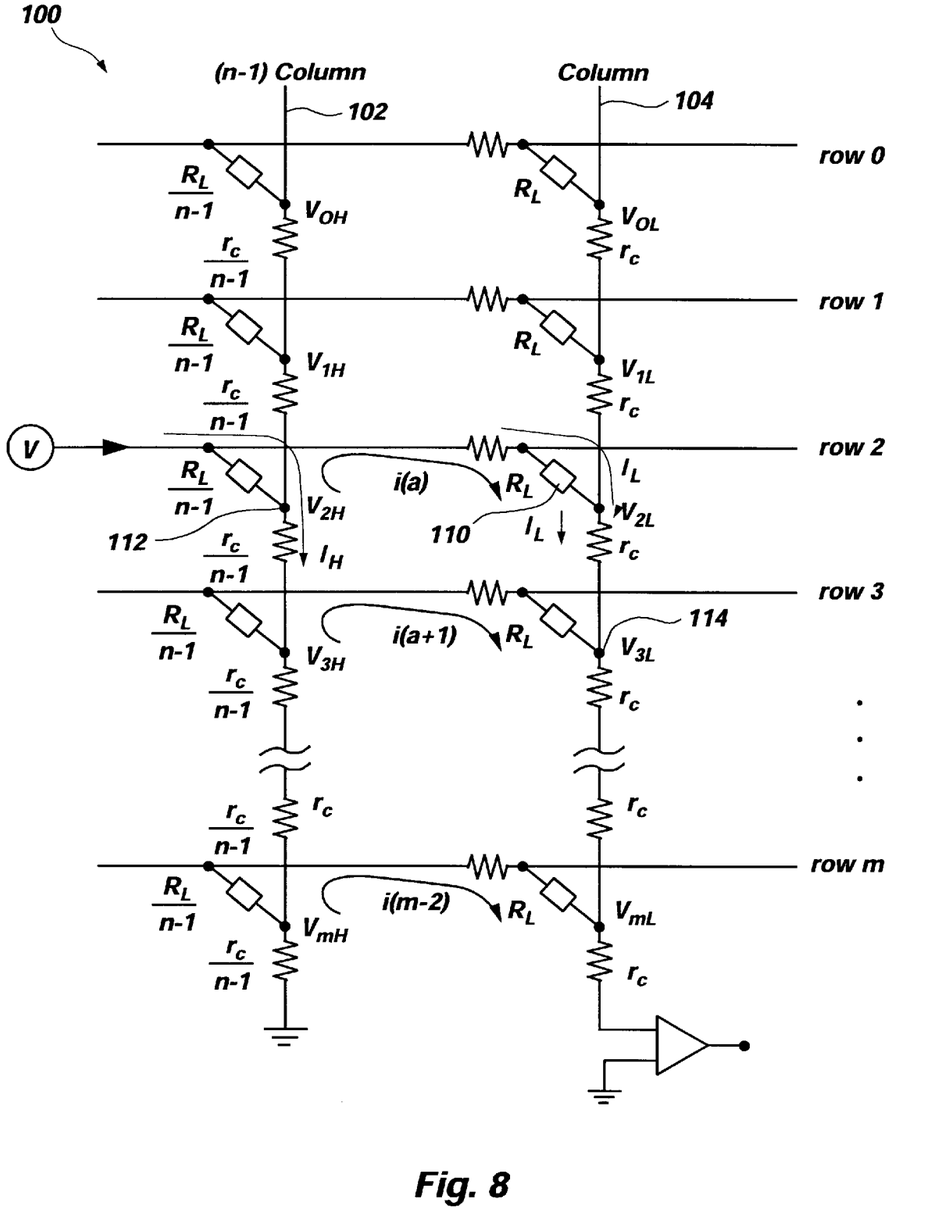

FIGS. 6, 7 and 8 provide circuitry to accompany the following analysis of the resistances in a resistive array. Referring to FIG. 6, an analysis is giving of the resistance along each row of a memory array. A resistive array 80 is shown in simplified circuitry having number of rows 1 through m, each having a conductor 82 and having a number of columns 1 through n, each having a conductor 84. At the intersection of each row and column conductor is a memory cell 86 connected between the row and column conductors. Each row conductor has some resistance to current flowing through it. The unit resistance along each row conductor 82 between each memory cell 86 is shown as resistances ($r_c$) 87, 88 and 89.

During the read process, a voltage is impressed on the selected row, resulting in a voltage $V_0$ at node 81 causing a current $I_0$ to flow through the memory cell 86a connected to node 91. Looking along row 0, unit resistance 87 causes a voltage drop between column 0 and column 1 so that a slightly lower voltage $V_1$ is impressed across memory cell 86b resulting in a current $I_1$ through the memory cell. An identical unit resistance 88 is encountered along row 0 between columns 1 and 2, resulting in a voltage $V_2$ across memory cell 86c causing a current $I_2$. Continuing along row 0, conductor 82a has a unit resistance between each column conductor 84 down to the last unit resistance 89, resulting in a voltage $V_n$ across memory cell 86n and a current $I_n$ therethrough. Essentially, the same phenomenon occurs with respect to each row 0 through m along columns 0 through n.

The mathematical analysis of the row conductor resistances makes the following assumptions:

1. Column conductor resistance is equal to zero.
2. The TMR junction resistance of each memory cell in the same row is a value R.
3. The row conductor has a unit resistance $r_c$.

To read a resistive cross-point array, a voltage V is applied to a selected row, the column conductors are connected either to ground or virtual ground of the sense amplifiers. As a result, there is no resistance or potential difference along the column conductors. Therefore, currents $I_0, I^1, \ldots I_n$ are confined to the corresponding column conductors $0, 1, \ldots n$. We can write the voltage for each node along the row as:

$$V_0 = V$$

$$V_1 = V_0 - r_c(I_1 + I_2 + \ldots I_n)$$

$$V_2 = V_1 - r_c(I_2 + I_3 + \ldots I_n)$$

$$V_3 = V_2 - r_c(I_3 + I_4 + \ldots I_n)$$

$$V_n = V_{n-1} - r_c(I_n)$$

For a reasonable size array less than about 1000 columns in a row, and where R is much less than $r_c$, then all currents $I_1, I_2, I_3, \ldots I_n$ are approximately equal and $I = V/R$. Therefore:

$$V_0 = V_1$$

$$V_1 = V - r_c I(n)$$

$$V_2 = V - r_c I[n + (n-1)]$$

$$V_3 = V - r_c I[n + (n-1) + (n-2)]$$

$$V_n = V - r_c I[n + (n-1) + (n-2) + (n-3) \ldots + 1]$$

Accordingly, a general equation for the voltage at any point (i) along the row can be written as:

$$V_i = V - r_c I \sum_{j\,0}^{i} (n - j)$$

Looking now at FIG. 7, a similar analysis can be made for the column resistances in array. A resistive array 90 is shown in simplified circuitry having a number of rows 1 through m, each having a conductor 92 and having a number of columns 1 through n, each having a conductor 94. At the intersection of each row and column conductor is a memory cell 96 connected between the row and column conductors. Each row conductor has some resistance to current flowing through it. The unit resistance along each row conductor 92 between each memory cell 96 is shown as resistances ($r_c$) 97, 98 and 99.

The mathematical analysis of the column conductor resistances makes the following assumptions:

1. Row conductor resistance is equal to zero.

2. In the worst-case analysis, the TMR junction resistance of selected memory cell is to be read in the high resistance state and the TNR junction resistance of all other cells is in the low resistance state.

3. R junction resistance is much greater than m times $r_c$.

Since all columns 0 to n−1 are identical, we can combine them together as shown in FIG. 8 without changing the electrical properties of the array. Thus the simplified array 100 in FIG. 8 has only two columns, the n column with a column conductor 104, which is the final column and the n−1 column with a combined conductor 102, which is a combination of all of the columns other than the n column.

To read a cell in the array 100, a voltage V is applied to the selected row, for example row 2, column n. The selected cell has two states, a high resistance state RH and a low resistance state RL. It is assumed that RH and RL are both much greater than m times $r_c$. Then:

$$I_H = \frac{V(n-1)}{R_L} \text{ and } I_L = \frac{V}{R_H}$$

Then for row 2, at the node 112:

$$V_{2H} = I_H \cdot (m-2) \frac{r_c}{n-1} = \frac{V}{R_L}(m-2) \cdot r_c$$

The voltage across the TMR junction of the last cell 110 in column n has the most error:

$$V_n = V - r_c I \sum_{j\,0}^{n} (n - j)$$

Error_row (%) = $(V - V_n)/V \times 100$ $$\text{Error\_row (\%)} = \frac{V - \left[V - r_c \frac{V}{R}\sum_{j\,0}^{n}(n-j)\right]}{V} \times 100$$

$$\text{Error\_row (\%)} = \left[\frac{r_c}{R}\sum_{j\,0}^{n} n - j\right] \times 100$$

So the error is proportional to row conductor resistance and array size and is inversely proportional to TMR junction resistance.

Note: If $r_c = 0.2$ ohms, $R = 10^6$ ohms and $n = 1000$, then there will be a 10% reduction in the voltage across the TMR junction at the end of the row.

For the voltage at node 114, $V_{3L} = I_L(m-2) \, r_c = V/R_H(m-2)r_c$

So for any given row, row 2 is replaced by a variable a:

$$V_H(a) = V/R_L(m-a)r_c$$

$$V_L(a) = V/R_H(m-a)r_c$$

It can be seen that there is a small difference between the potential voltage on (n−1) columns and the potential voltage on selected column n.

$$\Delta V(a) = V_H(a) - V_L(a)$$

$$\Delta V(a) = [V/R_L - V/R_H]r_c(m-a)$$

The small difference in voltage, ΔV (a), will cause a small leak current Δi (a) to flow through memory cell 110, as shown in FIG. 8.

$$\Delta i(a) = \frac{\Delta V(a)}{R_L + \frac{R_L}{n-1}} = [V/R_L - V/R_H]r_c(m-a-1)\left[\frac{1}{R_L + \frac{R_L}{n-1}}\right]$$

As a result, the total leakage current $I_{leak}$ at any given row "a" is estimated to be:

$$I_{leak(a)} = [V/R_L - V/R_H]\left[\frac{1}{R_L + \frac{R_L}{n-1}}\right]$$

$$r_c \cdot [(m-a) + (m-a-1) + (m-a-2)\ldots]$$

$$I_{leak(a)} = [V/R_L - V/R_H]\left[\frac{1}{R_L + \frac{R_L}{n-1}}\right]\left[r_c \cdot \sum_{j0}^{m-a}(m-a-i)\right]$$

Thus by selecting a memory cell to read on row 0, the sense current to determine the state of the memory cell will have the largest error due to a large leakage current, $I_{leak}$.

$$I_{leak} = [V/R_L - V/R_H]\left[\frac{1}{R_L + \frac{R_L}{n-1}}\right]\left[r_c \cdot \sum_{j0}^{m}(m-j)\right]$$

Where: $I_H=R/R_L$, $I_L+V/R_H$, $R_H=R_L(1+\Delta R/R_L)$ and $\Delta R=R_H-R_L$) $\Delta R/R_L$ (%) is the percent change of the TMR junction from a low resistance state to a high resistance state. The percent error relative to signal window IH–IL due to leakage current can be estimated:

$$\text{Error} - \text{column}(\%) = \left[\frac{I_{leak}}{I_H - I_L}\right] \times 100$$

$$\text{Error} - \text{column}(\%) = \frac{(V/R_L - V/R_H)}{(V/R_L - V/R_H)}\left[\frac{r_c}{R_L}\sum_{j0}^{m}(m-j)\right] \times 100$$

$$\text{Error} - \text{column}(\%) = \left[\frac{r_c}{R_L}\sum_{j0}^{m}(m-j)\right] \times 100$$

For a square matrix array, m=n, and the percent errors due to the row conductors resistance and the column conductor resistance are about the same.

The foregoing analysis provided an estimate of the errors due to the row and the column conductor resistance. These calculations indicate that the conductor resistance, the TMR junction resistance and the array size all have a significant effect on the error rate of the array.

Thus, a designer of the array needs to seek an optimum operating range for the conductor resistance, the TMR resistance and the array size.

In a standard fabrication process, particularly for an MRAM device, the conductor thickness is also chosen to optimize the writing of data. A narrow and thin conductor is better for writing, but causes relatively high conductor resistance that will reduce the signal-to-noise ratio (SNR). Therefore, the error rate will be relatively high. By using the invention described herein, optimized parameters can be obtained for better SNR for a selected array size and conductor resistance. Accordingly, error rate can be reduced and there will be less need for error correction software or circuitry.

Figure 9:
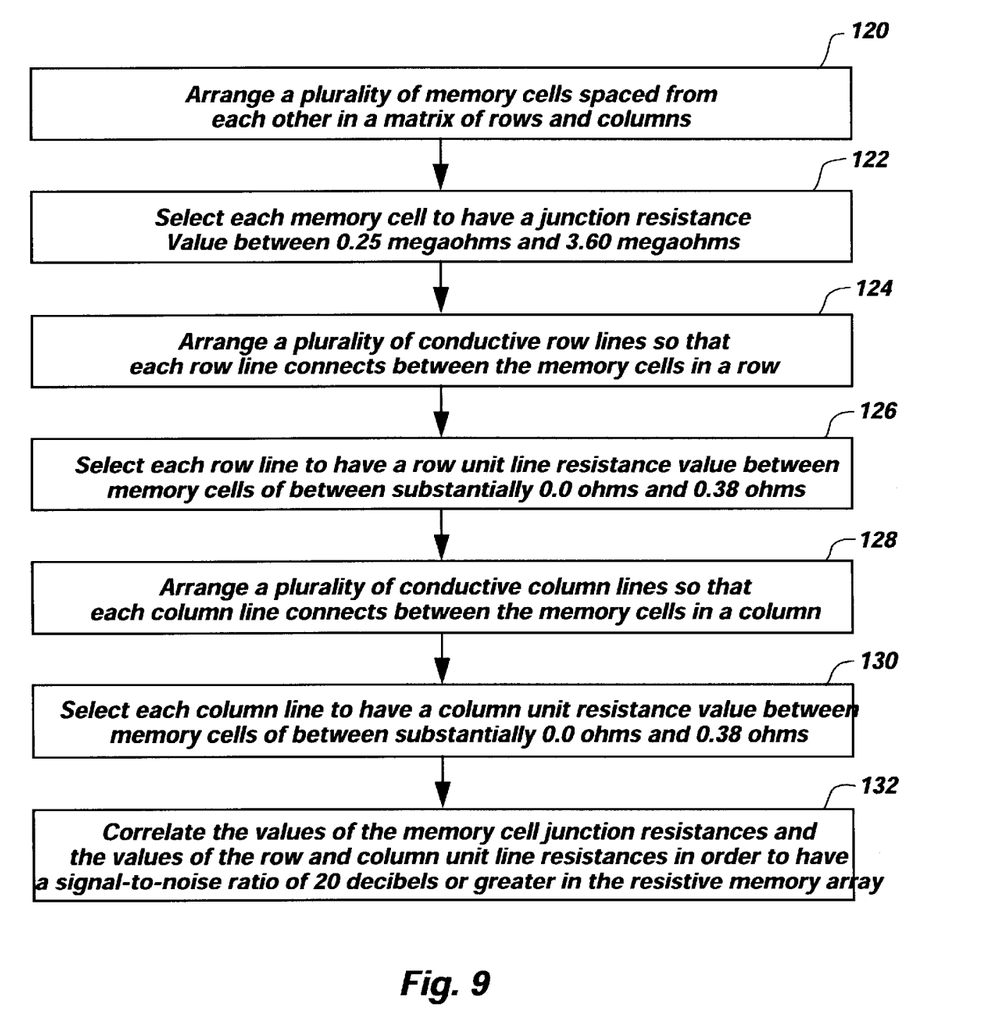
FIGS. 9 and 10 are flow diagrams illustrating preferred methods according to the present invention.
Figure 10:
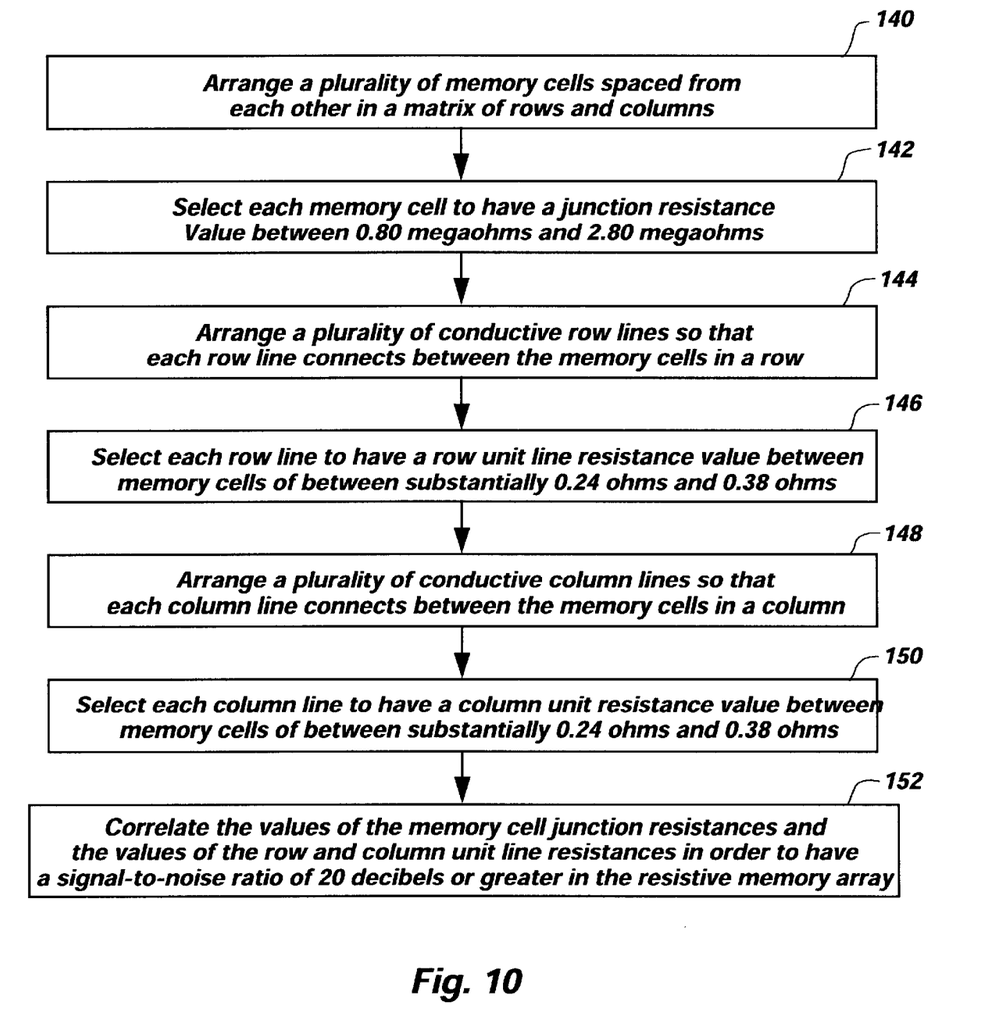

Looking now at FIGS. 9 and 10, flow diagrams are provided to further illustrate two preferred methods of the present invention. In FIG. 9, at step 120, a plurality of memory cells are spaced from each other in a matrix of rows and columns. At 122, each memory cell is selected to have a junction resistance value between 0,25 megaohms and 3.60 megaohms. Next, at step 124, a plurality of conductive row lines are connected between the memory cells in a plurality of rows. At 126, each conductive row line is selected to have a unit row resistance between adjacent memory cells, where the unit row resistance of each row has a value between substantially 0.0 ohms and 0.38 ohms. Next, at step 128, a plurality of conductive column lines are connected between the memory cells in a plurality of columns. At 130, each conductive column line is selected to have a unit column resistance between substantially 0.0 ohms and 0.38 ohms. Finally, at step 132, the values of the memory cell junction resistance and the values of the row and column unit line resistances are correlated in order to have a signal-to-noise ratio of 20 decibels or greater in the resistive memory array.

Another preferred method of the present invention is shown in FIG. 10. In FIG. 10, at step 140, a plurality of memory cells are spaced from each other in a matrix of rows and columns. At 142, each memory cell is selected to have a junction resistance value between 0,80 megaohms and 2.80 megaohms. Next, at step 144, a plurality of conductive row lines are connected between the memory cells in a plurality of rows. At 146, each conductive row line is selected to have a unit row resistance between adjacent memory cells, where the unit row resistance of each row has a value between substantially 0.24 ohms and 0.38 ohms. Next, at step 148, a plurality of conductive column lines are connected between the memory cells in a plurality of columns. At 150, each conductive column line is selected to have a unit column resistance between substantially 0.24 ohms and 0.38 ohms. Finally, at step 152, the values of the memory cell junction resistance and the values of the row and column unit line resistances are correlated in order to have a signal-to-noise ratio of 20 decibels or greater in the resistive memory array.

Although the above embodiments are representative of the present invention, other embodiments will be apparent to those skilled in the art from a consideration of this specification and the appended claims, or from a practice of the embodiments of the disclosed invention. It is intended that the specification and embodiments therein be considered as exemplary only, with the present invention being defined by the claims and their equivalents.

What is claimed is:

1. A method of designing a random access memory (RAM) array having resistive elements for maintaining a signal to noise ratio of 20 decibels or more for the array, comprising:
   (a) arranging a plurality of memory cells spaced from each other in a matrix of rows and columns, each memory cell being selected to have a junction resistance value between 0.25 megaohms and 3.60 megaohms;
   (b) arranging a plurality of conductive row lines, each row line connecting between the memory cells in a row and being selected to have a row unit line resistance value between memory cells of between substantially 0.0 ohms and 0.38 ohms;
   (c) arranging a plurality of conductive column lines, each column line connecting between the memory cells in a column and being selected to have a column unit line resistance value between memory cells of between substantially 0.0 ohms and 0.38 ohms; and (d) correlating the values of the memory cell junction resistances and the values of the row and column unit line resistances in order to have a signal-to-noise ratio of 20 decibels or in the resistive memory array.

2. The method recited in claim 1 wherein the values of the row or column unit line resistances are selected to between in the range between approximately 0.24 ohms and 0.38 ohms.

3. The method recited in claim 2, wherein the range of junction resistance is maintained between 0.8 megaohms and 2.8 megaohms.

4. The method recited in claim 1, wherein the junction resistance values of the memory cells and row or column unit line resistance values are correlated so that the ratio of junction resistance to row or column unit line resistance is approximately five million to one.

5. The memory array recited in claim 1 wherein the number of memory cells in a row are approximately equal to the number of memory cells in a column.

6. The method recited in claim 1, wherein, in a memory array having N rows and M columns, the junction resistance values are correlated to the total row or column line resistance values to maintain a ratio of junction resistance to total row or column line resistance of greater than approximately five million to N or M.

7. The method recited in claim 6, wherein N are M are equal to approximately 1,024 and the ratio of MTJ resistance to total row or column line resistance is maintained at approximately 5,000 or greater.

8. The method recited in claim 1 wherein the memory cells are magnetic RAM cells.

9. The method recited in claim 8, wherein the memory cell is a magnetic-resistive tunnel junction (MTJ) device having a MTJ resistance.

10. A resistive random access memory (RAM) array having element resistance values for maintaining a signal to noise ratio of 20 decibels or higher for the array, comprising:

(a) a plurality of memory cells spaced from each other in a matrix of rows and columns, each memory cell being selected to have a junction resistance value between 0.25 megaohms and 3.60 megaohms;

(b) a plurality of conductive row lines, each row line connecting between the memory cells in a row and being selected to have a row unit line resistance between memory cells of values between substantially 0.0 ohms and 0.38 ohms; and (c) a plurality of conductive column lines, each column line connecting between the memory cells in a column and being selected to have a column unit line resistance between memory cells, the row unit line resistance being approximately equal to the column unit line resistance;

(d) wherein, the values of the junction resistance are correlated with the values of row or column unit line resistance so that the signal to noise ratio is 20 decibels or greater in the resistive memory array.

11. The memory array recited in claim 10 wherein the number of memory cells in a row are approximately equal to the number of memory cells in a column.

12. The memory array recited in claim 10 wherein the plurality of memory cells are arranged in a 1,024 by 1,024 memory cell array, the row and column unit line resistance values are selected to fall in the range of between 0.24 ohms and 0.38 ohms, and the memory cells are selected to have a range of junction resistance between 0.8 megaohms and 2.8 megaohms.

13. The memory array recited in claim 10, wherein junction resistance values are correlated with the row or column unit line resistance values so that the ratio of junction resistance values to row or column unit line resistance values is approximately five million to one.

14. The memory array recited in claim 10, wherein the row and column unit line resistance values are selected so that the total row resistance of a row conductor is approximately equal to the total line resistance of a column conductor.

15. The memory array recited in claim 10 wherein the memory cells are magnetic RAM cells.

16. The memory array recited in claim 15, wherein the memory cell is a magneto-resistive tunnel junction (MTJ) device having a MTJ resistance.

17. The memory array recited in claim 16 wherein the MTJ device has a pinned layer that is fixed in magnetic orientation, a sense layer that changes between magnetic orientation states in response to the application of a magnetic field and an insulation layer between the pinned layer and the sense layer.

18. The memory array recited in claim 17, wherein the pinned layer is composed of an anti-ferromagnetic layer and a ferromagnetic pinned layer, and the sense layer is composed of magnetic material influenced by a magnetic field.

19. An magnetic random access memory (MRAM) array having resistive elements selected and correlated for maintaining an acceptable signal to noise ratio of the array, comprising:

(a) a plurality of magnetic-resistive tunnel junction (MTJ) memory cells spaced from each other in a square matrix of approximately N rows and N columns, each memory cell being selected to have an MTJ resistance value in the range of between 0.25 megaohms and 3.60 megaohms;

(b) a plurality of conductive row lines, each row line connecting between the memory cells in a row, each row line being selected to have a total row line resistance of N times a row unit resistance between memory cells having a value between 0.0 ohms and 0.38 ohms; and (c) a plurality of conductive column lines, each column line connecting between the memory cells in a column, each column line being selected to have a total column line resistance of N times the column unit resistance between memory cells having a value between 0.0 ohms and 0.38 ohms;

(d) wherein the MTJ resistance is correlated with the total row or column line resistance so that the ratio of the MTJ resistance to the total row or column line resistance is greater than approximately five million to N, in order to maintain a signal-to-noise ratio of at least 20 decibels in the resistive memory array.

20. The MRAM memory array recited in claim 19, wherein N is equal to approximately 1,024 and the MTJ resistance is correlated to the total row or column line resistance to maintain a ratio between MTJ resistance and total row or column resistance at approximately 5,000 or greater.

* * * * *